US005478493A

United States Patent [19]

Flaningam et al.

[11] Patent Number: 5,478,493

[45] Date of Patent: Dec. 26, 1995

[54] HEXAMETHYLDISILOXANE CONTAINING AZEOTROPES

[75] Inventors: Ora L Flaningam; Dwight E. Williams, both of Midland, Mich.

[73] Assignee: Dow Corning Corporation, Midland, Mich.

[21] Appl. No.: 260,423

[22] Filed: Jun. 15, 1994

[51] Int. Cl.[6] ................................ C11D 7/26; C11D 7/50; B08B 3/08; H05K 3/26

[52] U.S. Cl. ......................... 252/174.15; 134/38; 134/39; 134/40; 252/162; 252/170; 252/171; 252/DIG. 9

[58] Field of Search .................................... 252/162, 170, 252/171, 174.15, DIG. 9; 134/38, 39, 40

[56] References Cited

U.S. PATENT DOCUMENTS

| | | | |
|---|---|---|---|
| 4,324,595 | 4/1982 | Kasprzak | 134/38 |
| 4,954,335 | 9/1990 | Janchipraponvej | 424/70 |
| 5,286,476 | 2/1994 | Nanba et al. | 424/47 |
| 5,316,692 | 5/1994 | John | 252/174.15 |

FOREIGN PATENT DOCUMENTS

| | | |
|---|---|---|
| 473795 | 3/1992 | European Pat. Off. . |
| 6-136389 | 5/1994 | Japan . |
| 6-202051 | 7/1994 | Japan . |
| 6-200294 | 7/1994 | Japan . |
| 6-292868 | 10/1994 | Japan . |
| 6-306392 | 11/1994 | Japan . |
| WO9314184 | 7/1993 | WIPO . |

OTHER PUBLICATIONS

Kaczmarek, B., *J. Chem. Eng. Data,* vol. 30, pp. 249–251, 1985 no moth available.

Diss. Abstr. Intl. B, J. A. Guzman, 1973 no month available, 34(5), 2000 B–2001B.

Inz. Chem., A. Radecki et al, 1975 no month available, 5(4), 861. (Abstract Only).

J. Chem. Eng. Data, A. Radecki et al, 1980 no month available, 25, 230–232.

J. Chem. Eng. Data, G. A. Killgore, 1966 no month available, 11(4), 535–537.

Fluid Phase Equilibrium, J. A. Gusman, 1981 no month available, 7, 187–195.

*Primary Examiner*—Linda Skaling Therkorn

*Attorney, Agent, or Firm*—James L. DeCesare

[57] ABSTRACT

New binary azeotropes of hexamethyldisiloxane with certain alcohols, and the use of the binary azeotropes as environmentally friendly cleaning agents are disclosed. The alcohol component of the binary azeotrope is 3-methyl-3-pentanol $C_2H_5C(CH_3)(OH)\ C_2H_5$; 2-pentanol $CH_3CH_2CH_2CH(OH)\ CH_3$, or 1-methoxy-2-propanol $CH_3OCH_2CH(CH_3)OH$.

21 Claims, No Drawings

HEXAMETHYLDISILOXANE CONTAINING AZEOTROPES

BACKGROUND OF THE INVENTION

This invention is directed to an environmentally friendly cleaning agent, and more particularly to a cleaning agent which is a silicone containing binary azeotrope.

Because of local, state, federal, and international regulations, aimed at restricting the use of certain chemicals, the search for suitable replacements is an ever increasing dilemma faced by the chemical and industrial sectors. The magnitude of the problem is exemplified below.

In the 1970s, the US Environmental Protection Agency (EPA) named as their criteria or "hazardous pollutants" sulfur dioxide $SO_2$, carbon monoxide CO, nitrogen dioxide $NO_2$, ozone $O_3$, suspended particulates with a diameter of ten microns or less $PM_{10}$, lead Pb, and nonmethane hydrocarbons (NMHC) which are now known as "volatile organic compounds" (VOC).

The most abundant species of photochemical smog is ozone. Ozone precursors are VOC, nitric oxide NO, and $NO_2$. In order to reduce ozone in a polluted atmosphere, reductions in VOC and nitrogen oxide $NO_x$ (NO and $NO_2$) precursors has been required.

Solar energy is absorbed by the surface of the earth and re-emitted as radiation. Certain gases in the atmosphere are capable of absorbing the re-emitted radiation and translating it into heat (THE GREENHOUSE EFFECT). The result is a higher atmospheric temperature (GLOBAL WARMING) than would be obtained in the absence of these "GREENHOUSE GASES". Accordingly, reductions in the emission of such gases has been required, including carbon dioxide $CO_2$, methane $CH_4$, nitrous oxide $N_2O$, ozone, and a variety of chloro, fluoro, and chlorofluorocarbons (CFC) such as methylchloroform $CH_3CCl_3$, carbon tetrachloride $CCl_4$, $C_2HF_5$ (HCFC-125), $C_2H_2F_4$ (HFC-134a), and chlorofluorocarbons such as $CFCl_3$ (CFC-11), $CF_2Cl_2$ (CFC-12), $C_2ClF_5$ (CFC-115), $CHClF_2$ (HCFC-22), $C_2HCl_2F_3$ (HCFC-123), $C_2HClF_4$ (HCFC-124), and $C_2Cl_3F_3$ (CFC-113).

Stratospheric ozone is a natural shield against the penetration of uv-light in the rays of the sun. There has been concern that any process which depletes stratospheric ozone will increase the amount of uv-B radiation (293–320 nm) reaching the surface of the earth. Increased uv-B radiation may lead to the increased incidence of skin cancer. CFC's diffuse through the troposphere (up to 10 miles) and into the mid-stratosphere (up to 30 miles), where they are photolyzed by uv radiation and destroy ozone molecules. Because of STRATOSPHERIC OZONE DEPLETION, mandates such as the 1990 Clean Air Act Amendment contain a phaseout schedule for CFC's, halons (bromochlorofluorocarbons and bromofluorocarbons), carbon tetrachloride, and methylchloroform.

These are only a few of the problems faced by the chemical and industrial sectors in finding suitable replacements for such chemicals. Of particular interest according to the present invention, however, is the VOC aspect of the problem and the provision of a suitable substitute material.

Thus, "volatile organic compounds" (VOC) and "volatile organic material" (VOM) are defined by Federal statute in Title 40 CFR 51.100 (s) to be any compound of carbon, excluding carbon monoxide, carbon dioxide, carbonic acid, metallic carbides, or carbonates, and ammonium carbonate, which participates in atmospheric photochemical reactions.

The definition excludes certain compounds and classes of compounds as VOC or VOM.

Scientifically, VOC has been defined as any compound of carbon that has a vapor pressure greater than 0.1 millimeters of mercury at a temperature of twenty degrees Centigrade and a pressure of 760 millimeters mercury; or if the vapor pressure is unknown, a compound with less than twelve carbon atoms. "Volatile organic content" is the amount of volatile organic compounds (VOC) as determined according to EPA Test Method 24 or 24A, the procedures of which are set forth in detail in Title 40 CFR Part 60 Appendix A.

Reduction of VOC has already been mandated in several states, and regulations in California for example, require less than about 180 grams of volatiles per liter of any product which enters the atmosphere. This amount can be determined by baking ten grams of a product in an oven at 110 degrees Centigrade for one hour. The amount of solids which remain is subtracted from the total of the ten grams which was tested. Calculations are based on the weight of the volatiles that have evaporated, and the amount is reported as grams per liter.

The EPA has identified many volatile organic compounds (VOC) present in consumer products among which are such common solvents as ethanol, isopropyl alcohol, kerosene, and propylene glycol; and common hydrocarbon solvents such as isobutane, butane, and propane, which are often employed as propellants.

The state of California under the auspices of the California Air Regulation Board (CARB), has proposed standards which would limit and reduce the amount of volatile organic compounds (VOC) permitted in various chemically formulated products used by household and institutional consumers. These regulations cover products such as detergents; cleaning compounds; polishes; floor products; cosmetics; personal care products; home, lawn and garden products; disinfectants; sanitizers; and automotive specialty products.

These CARB type standards would effect such widely used common consumer products such as shaving lather, hairspray, shampoos, colognes, perfumes, aftershave lotions, deodorants, antiperspirants, suntan preparations, breath fresheners, and room deodorants.

However, the problem of finding a suitable replacement for "outlawed" chemicals can be solved, according to this invention, by the use of certain volatile methyl siloxanes (VMS) as a solvent substitute.

In fact, the EPA in Volume 58, No. 90, of *The Federal Register*, 28093–28193, (May 12, 1993), has indicated at Page 28132 that "Cyclic and linear volatile methyl siloxanes (VMSs) are currently undergoing investigation for use as substitutes for Class I compounds in electronic and precision cleaning. Because of their chemical properties, these compounds show promise as substitutes for cleaning precision guidance equipment in the defense and aerospace industries. In addition, the volatile methyl siloxanes have high purity and are therefore relatively easy to recover and recycle. In the cleaning process using VMS, the fluids are used to clean parts in a closed header system using a totally enclosed process. The parts are drained and then dried using vacuum baking.".

At Page 28175, the EPA goes on to state that although the "Agency has not completed review of data. Preliminary indications are that this substitute merits approval.". This is in reference to inclusion in the list of "acceptable substitutes" as precision and electronic cleaning substances in the EPA Significant New Alternatives Policy (SNAP).

In addition, a petition to the EPA filed in late 1992 is pending seeking exemption of these volatile methyl siloxanes (VMS) from regulation as VOC. The basis for the petition is that the volatile methyl siloxanes do not contribute to, and in some cases actually inhibit the formation of tropospheric ozone. Thus, the volatile methyl siloxanes have a lower ozone formation potential than ethane, which is the most reactive compound on a list of "exempt" VOC.

Furthermore, these volatile methyl siloxanes (VMS) have an atmospheric lifetime of between 10 to 30 days. Consequently, VMS compounds do not contribute significantly to global warming. Volatile methyl siloxanes have no potential to deplete stratospheric ozone due to their short atmospheric lifetimes so that they will not rise and accumulate in the stratosphere. VMS compounds also contain no chlorine or bromine atoms.

Volatile methyl siloxane compounds (VMS) neither attack the ozone layer nor do they contribute to tropospheric ozone formation (Smog), and they have minimum GLOBAL WARMING potential. Volatile methyl siloxane compounds are hence unique in possessing these three attributes simultaneously.

Thus, it should be apparent that volatile methyl siloxanes provide a viable solution to the problem of finding a suitable replacement for "outlawed" chemicals heretofore commonly used as cleaning agents.

SUMMARY OF THE INVENTION

The invention is related to new binary azeotropes of a silicone fluid which is a volatile methyl siloxane with certain alcohols.

The invention is also related to the use of these new silicone containing azeotropes as an environmentally friendly cleaning agent.

As cleaning agents, the new azeotropes can be used to remove contaminants from any surface, but are particularly useful in applications related to defluxing and precision cleaning; low-pressure vapor degreasing; and vapor phase cleaning; for example.

The advantages and benefits provided by and derived as a result of using these new silicone containing azeotropes as cleaning agents include their enhanced solvency power, and their ability to maintain a constant solvency power following evaporation which may occur during applications involving vapor phase cleaning, distillative regeneration, and wipe cleaning.

Because the cleaning agent according to the invention is in the form of an azeotrope, it further possesses the added advantage and benefit in that it can be more easily recovered and recirculated. Thus, the azeotrope can be separated from the contaminated cleaning bath effluent after its use in the cleaning process, and by simple distillation, its regeneration is facilitated whereby it may be recirculated in the system as a fresh cleaning agent influent.

In addition, these azeotropes provide an advantage over azeotropes known heretofore in that they are higher in silicone fluid content and correspondingly lower in alcohol content, than previously discovered azeotropes of silicone fluids and lower molecular weight alcohols such as ethanol. The result is that the azeotropes of the present invention are less inclined to generate tropospheric ozone and smog.

These and other features, objects, and advantages, of the present invention will become more apparent from a consideration of the following detailed description thereof.

DETAILED DESCRIPTION OF THE INVENTION

As is well known, an azeotrope is a mixture of two or more liquids, the composition of which does not change upon distillation. For example, a mixture of 95% ethanol and 5% water boils at a lower temperature of 78.15° Centigrade, than either pure ethanol which boils at a temperature of 78.3° Centigrade, or pure water which boils at a temperature of 100° Centigrade. Such liquid mixtures behave like a single substance in that the vapor produced by partial evaporation of liquid has the same composition as the liquid. Thus, these mixtures distill at a constant temperature without change in their composition and cannot be separated by normal distillation procedures.

For purposes of this invention, a mixture of two or more components is azeotropic, if it vaporizes with no change in the composition of the vapor from the liquid. Specifically, azeotropic mixtures include both mixtures that boil without changing composition, and mixtures that evaporate at a temperature below the boiling point without changing composition. Accordingly, an azeotropic mixture may include mixtures of two components over a range of proportions where each specific proportion of the two components is azeotropic at a certain temperature, but not necessarily at other temperatures.

Azeotropes exist in systems containing two liquids (A and B) termed binary azeotropes, in systems containing three liquids (A, B, and C) termed ternary azeotropes, and in systems containing four liquids (A, B, C, and D) termed quaternary azeotropes. The azeotropes of this invention are binary azeotropes. However, as is well known in the art, azeotropism is an unpredictable phenomenon, and each azeotropic composition must be discovered.

The volatile methyl siloxane used to form azeotropes according to this invention is hexamethyldisiloxane. Hexamethyldisiloxane has the formula $Me_3SiOSiMe_3$ in which Me is the methyl group. It is a clear fluid, essentially odorless, nontoxic, nongreasy and nonstinging. It will leave substantially no residue after thirty minutes at room temperature when one gram of the fluid is placed at the center of No. 1 circular filter paper which has a diameter of 185 millimeters, and which is supported at its perimeter in open room atmosphere. Hexamethyldisiloxane has a viscosity measured at twenty-five degrees Centigrade of 0.65 centistokes ($mm^2/s$).

Azeotropes vaporize with no change in their composition. If the applied pressure is above the vapor pressure of the azeotrope, the azeotrope evaporates without change. If the applied pressure is below the vapor pressure of the azeotrope, the azeotrope boils or distills without change. The vapor pressure of low boiling azeotropes is higher, and the boiling point is lower than that of the individual components. In fact, the azeotropic composition has the lowest boiling point of any composition of its components. Thus, the azeotrope can be obtained by distillation of a mixture whose composition initially departs from that of the azeotrope.

Since only some combinations of components can form azetropes, the formation of an azeotrope cannot be reliably predicted without experimental vapor-liquid-equilibria (VLE) data, that is vapor and liquid compositions at constant total pressure or temperature for various mixtures of the components. The composition of some azeotropes is invariant to temperature, but in many cases, however, the azeotropic composition shifts with temperature. The azeotropic composition as a function of temperature can be determined from high quality VLE data at a given temperature. Commercial software is available to make such determinations. The ASPENPLUS® program from Aspen Technology, Inc., of Cambridge, Mass., is an example of such a program. Given experimental data, such programs can calculate parameters from which complete tables of composition and vapor pressure may be generated, which allows a user of the system to determine where an azeotropic composition is located.

The binary azeotrope according to the present invention includes hexamethyldisiloxane and an alcohol. The alcohol can be one of 3-methyl-3-pentanol having the formula $C_2H_5C(CH_3)(OH)C_2H_5$; 2-pentanol (1-methyl-butyl alcohol) having the formula $CH_3CH_2CH_2CH(OH)CH_3$; and 1-methoxy-2-propanol having the formula $CH_3OCH_2CH(CH_3)OH$.

The boiling point of each of the above liquids in Centigrade degrees measured at the standard barometric pressure of 760 millimeters of mercury is 100.5° for hexamethyldisiloxane; 122° for 3-methyl-3-pentanol; 119° for 2-pentanol; and 120° for the alkoxy containing aliphatic alcohol 1-methoxy-2-propanol.

One especially significant and unexpected result which has been seen to flow from the use of the azeotropes of the invention is that they have been shown to possess an enhanced solvency power in comparison to the use of hexamethyldisiloxane alone, yet at the same time the azeotropes exhibit a mild solvency power making them useful for cleaning delicate surfaces without doing harm to the surface to be cleaned.

The following examples are set forth for the purpose of illustrating the invention in more detail. New homogeneous binary azeotropes of hexamethyldisiloxane were discovered with three different alcohols. These azeotropes contained 8 to 18 percent by weight of 1-methoxy-2-propanol, 1 to 14 percent by weight of 2-pentanol, and 1 to 7 percent by weight of 3-methyl-3-pentanol, respectively with hexamethyldisiloxane. The azeotropes were homogeneous in that they had a single liquid phase at both the azeotropic temperature and also at room temperature. Each azeotrope was found to exist over a particular temperature range. Within that range, the azeotropic composition shifted somewhat with temperature. The compositions were azeotropic at a temperature within the range of 12 to 108 degrees centigrade inclusive.

EXAMPLE I

There was employed a single-plate distillation apparatus for measuring vapor-liquid equilibria. The liquid mixture was boiled and the vapor condensed into a small receiver which had an overflow path to recirculate back to the boiling liquid. When equilibrium was established, samples of the boiling liquid and of the condensed vapor were separately removed and quantitatively analyzed by gas chromatography (GC). The measured temperature, ambient pressure, and the liquid and vapor compositions, were obtained at several different initial compositional points. These data were used to determine whether an azeotropic composition existed. The azeotropic composition at different temperatures was determined by using the same data with the assistance of the ASPENPLUS® software program to perform the quantitative determinations. The azeotropic compositions are shown below in Table I. In Table I, "MM" is used to designate the weight percent in the azeotropic composition of hexamethyldisiloxane. The vapor pressure VP in Table I is shown in torr pressure units. Further, the alcohols in Table I are abbreviated as "3-Me-3-pentanol" for 3-methyl-3-pentanol; and "1-Meo-2-propanol" for 1-methoxy-2-propanol. The accuracy in determining the azeotropic compositions is approximately plus or

TABLE I

| ALCOHOL | TEMPERATURE °C. | VP (torr) | WEIGHT % MM |
|---|---|---|---|
| 1-Meo-2-propanol | 103 | 950 | 82 |
| | 95.7 | 760 | 82 |
| | 75 | 379.1 | 85 |
| | 50 | 143.1 | 88 |
| | 25 | 44.6 | 90 |
| | 12 | 22.2 | 92 |
| 2-pentanol | 105 | 950 | 86 |
| | 97.8 | 760 | 87 |
| | 75 | 350.8 | 92 |
| | 50 | 132.0 | 97 |
| | 37 | 74.5 | 99 |
| 3-Me-3-pentanol | 108 | 950 | 93 |
| | 100 | 760 | 93 |
| | 75 | 340.4 | 96 |
| | 50 | 131.5 | 97 |
| | 37 | 74.5 | 99 |

The azeotropic compositions of the invention are particularly useful for cleaning precision articles made of metal, ceramic, glass, and plastic. Examples of such articles are electronic and semiconductor parts, electric and precision machinery parts such as ball bearings, optical parts and components such as lenses, photographic and camera parts and equipment, and military and space hardware such as precision guidance equipment used in the defense and aerospace industries.

One especially useful application of the azeotropic compositions of the invention is the cleaning and removal of fluxes used in mounting and soldering electronic parts on printed circuit boards. Thus, in making a mechanical, electromechanical, or electronic connection, a solder is typically used. For example, in making electronic connections, the components are attached to the conductor paths of a printed wiring assembly by wave soldering. The solder used is usually a tin-lead alloy, with the aid of a flux which is rosin based. Rosin is a complex mixture of isomeric acids principally abietic acid. These rosin fluxes often also contain activators such as amine hydrohalides and organic acids. The function of the flux is that it reacts with and removes surface compounds such as oxides, it reduces the surface tension of the molten solder alloy, and it prevents oxidation during the heating cycle by providing a surface blanket to the base metal and solder alloy.

After the soldering operation, however, it is usually necessary to perform a final cleaning of the assembly. The azeotropic compositions of the invention can be used on the assembly in order to carefully clean it, in order to remove any flux residues and oxides formed on areas unprotected by the flux during soldering, which are corrosive or whose presence would cause malfunctioning or short circuiting of electronic assemblies. The azeotropic compositions can be used as cold cleaners in such cases, or as vapor degreasers, or accompanied with ultrasonic energy.

The azeotropic compositions of this invention can also be used to remove carbonaceous materials from the surface of the above types of articles, as well as from the surface of various other industrial articles. Exemplary of carbonaceous materials are any carbon containing compound or mixtures of carbon containing compounds, which are soluble in one or more of the common organic solvents, such as hexane, toluene, or 1,1,1-trichloroethane.

For the purpose of further illustrating the invention, the use of the azeotropes for cleaning was tested using a rosin-based solder flux as the soil. All three of the above azeotropes were tested. The cleaning tests were conducted at 22° Centigrade in an open bath with no distillative recycle of the azeotrope. All of the azeotropes were found to remove flux, although not each of the azeotropes was equally effective. For purposes of comparison, a CONTROL consisting of only hexamethyldisiloxane was included in these cleaning tests, and is shown in Table II as "No. 5".

EXAMPLE II

A uniform thin layer of Kester #1544 rosin flux to which had been added 0.05 weight percent of a flow-out additive was applied to a two inch by three inch area of an Aluminum Q panel with #36 Industry Tech, Inc. draw-down rod. The flux was an activated rosin-based solder flux commonly used for electrical and electronic assemblies. It is a product which is manufactured and sold by Kester Solder Division, Litton Industries, Des Plaines, Ill., USA. It contains about fifty weight percent of a modified rosin, about twenty-five weight percent of ethanol, about twenty-five weight percent of 2-butanol, and about one weight percent of a proprietary activator. The flow-out additive used was a nonreactive low viscosity silicone glycol copolymer surfactant. The coating was allowed to dry at room temperature and cured at 100° C. for ten minutes in an air oven. The Aluminum Q panel was placed in a large beaker which had a magnetic stirring bar at the bottom and one-third filled with the azeotropic composition. Cleaning was conducted while rapidly stirring at room temperature, even when cleaning with the higher temperature azeotropic compositions. The panel was removed at timed intervals, dried at 80° C. for ten minutes, weighed, and reimmersed for additional cleaning. The initial coating weight and the weight loss were measured as a function of cumulative cleaning time, and this data is shown below in Table II. In Table II, the alcohols are abbreviated as "3-M-3-P" for 3-methyl-3pentanol; "2-PENT" for 2-pentanol; and "1-M-2-P" for 1-methoxy-2-propanol. The "WT %" shown in Table II refers to the weight percent of the alcohol in the azeotrope. The "TEMP" is the azeotropic temperature in Centigrade degrees of the azeotrope. The "WT" is the initial weight of the coating in grams. The time shown in Table II is cumulative time measured after the elapse of one minute, five minutes, ten minutes, and thirty minutes.

TABLE II

CLEANING EXTENT AT ROOM TEMPERATURE (22° C.)

| | WT | ALCO- | | | % REMOVED (Time) | | | |
|---|---|---|---|---|---|---|---|---|
| No. | % | HOL | TEMP | WT | 1 | 5 | 10 | 30 |
| 1 | 18% | 1-M-2-P | 95.7 | 0.2403 | 99.7 | 100.0 | — | — |
| 2 | 10% | 1-M-2-P | 25.0 | 0.1137 | 91.7 | 95.9 | 96.9 | 98.1 |
| 3 | 13% | 2-PENT | 97.8 | 0.1744 | 84.9 | 98.1 | 98.9 | 99.3 |
| 4 | 7% | 3-M-3-P | 99.97 | 0.1593 | 9.0 | 36.4 | 56.1 | 82.0 |
| 5 | 0% | — | — | 0.1294 | 0.5 | 4.1 | 6.7 | 15.8 |

The azeotropes described according to this invention have several advantages for cleaning, rinsing, or drying. Thus, the azeotropic composition can easily be regenerated by distillation so that the performance of the cleaning mixture can be restored after a period of use. The performance factors which can be affected by the composition of azeotropic mixtures include bath life, cleaning speed, lack of flammability when only one component is non-flammable, and lack of damage to sensitive parts.

In vapor phase degreasing equipment, the azeotropic mixture can be continually restored by continuous distillation at atmospheric or at reduced pressure, and can be continually recycled in the cleaning equipment. In this type of equipment, cleaning or rinsing can be conducted at the boiling point by plunging the part to be cleaned or rinsed in the boiling liquid, or by allowing the refluxing vapor to condense on the cold part. Alternatively, the part may be immersed in a cooler bath that is continually fed by fresh condensate, and the dirty overflow liquid is returned to a boil sump.

If the azeotrope is used in an open system, the composition and the performance of the azeotrope will remain constant even though evaporative losses occur. Such a system can be at room temperature when used in a ambient cleaning bath, or when used as a wipe-on-by-hand cleaner. Alternatively, the cleaning bath can be operated at elevated temperatures but below the boiling point, although often cleaning, rinsing, or drying, occurs faster at elevated temperatures, and hence is desirable when the part to be cleaned and the equipment permit.

The azeotropes of this invention can be used for cleaning in a variety of ways beyond those shown by the foregoing examples. Thus, cleaning can be conducted by using a given azeotrope at or near its azeotropic temperature (No. 2 in Table II), or at some other temperature (No. 1, No. 3, and No. 4 in Table II).

Other processes of use of the azeotropes of the invention include the distillative recycle of a spent azeotrope at atmospheric pressure, or at a reduced pressure. In addition, cleaning may be conducted by immersing the part to be cleaned in quiescent or boiling liquid, as well as in the vapor condensation region above the boiling liquid. In the later case, the part is cleaned in a continually renewed liquid of maximum cleaning power.

Other variations and modifications may be made in the compounds, compositions, and methods described herein, without departing from the essential features and concepts of the present invention.

The forms of the invention described herein are exemplary only, and are not intended as limitations on the scope of the invention as defined in the appended claims.

That which is claimed is:

1. A composition consisting essentially of a) about 93 to about 99 percent by weight hexamethyldisiloxane and about 1 to about 7 percent by weight 3-methyl-3-pentanol $C_2H_5C(CH_3)(OH)C_2H_5$ wherein the composition is homogenous and azeotropic at a temperature within the range of 37 to 108 degrees Centigrade inclusive and wherein the composition has a vapor pressure of 950 Torr at 108 degrees Centigrade when the composition consists essentially of 93 percent by weight hexamethyldisiloxane and 7 percent by weight 3-methyl-3-pentanol and wherein the composition has a vapor pressure of 74.5 Torr at 37 degrees Centigrade when the composition consists essentially of 99 percent by weight hexamethyldisiloxane and 1 percent by weight 3-methyl-3-pentanol, or b) about 86 to about 99 percent by weight hexamethyldisiloxane and about 1 to about 14 percent by weight 2-pentanol $CH_3CH_2CH_2CH(OH)C_2H_5$ wherein the composition is homogenous and azeotropic at a temperature within the range of 37 to 105 degrees Centigrade inclusive and wherein the composition has a vapor pressure of 950 Torr at 105 degrees Centigrade when the composition consists essentially of 86 percent by weight hexamethyldisiloxane and 14 percent by weight 2-pentanol and wherein the composition has a vapor pressure of 74.5 Torr at 37 degrees Centigrade when the composition consists essentially of 99 percent by weight hexamethyldisiloxane and 1 percent by weight 2-pentanol, or c) about 82 to about 92 percent by weight hexamethyldisiloxane and about 8 to about 18 percent by weight 1-methoxy-2-propanol $CH_3OCH_2CH(CH_3)OH$ wherein the composition is homogenous and azeotropic at a temperature within the range of 12 to 103 degrees Centigrade inclusive and wherein the composition has a vapor pressure of 950 Torr at 103 degrees Centigrade when the composition consists essentially of 82 percent by weight hexamethyldisiloxane and 18 percent by weight 1-methoxy-2propanol and wherein the composition has a vapor pressure of 22.2 Torr at 12 degrees Centigrade when the composition consists essentially of 92 percent by weight hexamethyldisiloxane and 8 percent by weight 1-methoxy-2-propanol.

2. A composition according to claim 1 consisting essentially of 1to 7 percent by weight of 3-methyl-3-pentanol $C_2H_5C(CH_3)(OH)C_2H_5$ and 93 to 99 percent by weight of hexamethyldisiloxane.

3. A composition according to claim 1 consisting essentially of 1to 14 percent by weight of 2-pentanol $CH_3CH_2CH_2CH(OH)CH_3$ percent by weight of hexamethyldisiloxane.

4. A composition according to claim 1 consisting essentially of 8 to 18 percent by weight of 1-methoxy-2-propanol $CH_3OCH_2CH(CH_3)OH$ and 82 to 92 percent by weight of hexamethyldisiloxane.

5. A composition according to claim 1 consisting essentially of 7 percent by weight of 3-methyl-3-pentanol $C_3H_5C(CH_3)(OH)C_2H_5$ and about 93 percent by weight of hexamethyldisiloxane.

6. A composition according to claim 1 consisting essentially of about 4percent by weight of 3-methyl-3-pentanol $C_2H_5C(CH_3)(OH)C_2H_5$ and about 96 percent by weight of hexamethyldisiloxane.

7. A composition according to claim 1 consisting essentially of percent by weight of 3-methyl-3-pentanol $CH_2H_5C(CH_3)(OH)C_2H_5$ and about 97 percent by weight of hexamethyldisiloxane.

8. A composition according to claim 1 consisting essentially of about 13 percent by weight of 2-pentanol $CH_3CH_2CH_2CH(OH)CH_3$ and about 87 percent by weight of hexamethyldisiloxane.

9. A composition according to claim 1 consisting essentially of about 8 percent by weight of 2-pentanol $CH_3CH_2CH_2CH(OH)CH_3$ and about 92 percent by weight of hexamethyldisiloxane.

10. A composition according to claim 1 consisting essentially of about 3 percent by weight of 2-pentanol $CH_3CH_2CH_2CH(OH)CH_3$ and about 97 percent by weight of hexamethyldisiloxane.

11. A composition according to claim 1 consisting essentially of about 18 percent by weight of 1-methoxy-2-propanol $CH_3CH_2CH(CH_3)OH$ and about 82 percent by weight of hexamethyldisiloxane.

12. A composition according to claim 1 consisting essentially of about 15 percent by weight of 1-methoxy-2-propanol $CH_3OCH_2CH(CH_{43})OH$ and about 85 percent by weight of hexamethyldisiloxane.

13. A composition according to claim 1 consisting essentially of about 12 percent by weight of 1-methoxy-2-propanol $CH_3OCH_2CH(CH_3)OH$ and about 88 percent by weight of hexamethyldisiloxane.

14. A composition according to claim 1 consisting essentially of about 10 percent by weight of 1-methoxy-2-propanol $CH_3OCH_2CH(CH_3)OH$ and about 90 percent by weight of hexamethyldisiloxane.

15. A composition according to claim 1 consisting essentially of about 1percent by weight of 3-methyl-3-pentanol $C_2H_5C(CH_3)(OH)C_2H_5$ and about 99 percent by weight of hexamethyldisiloxane.

16. A composition according to claim 1 consisting essentially of about 14 percent by weight of 2-pentanol $CH_3CH_2CH_2CH(OH)CH_3$ and about 86 percent by weight of hexamethyldisiloxane.

17. A composition according to claim 1 consisting essentially of about percent by weight of 2-pentanol $CH_3CH_2CH_2CH(OH)CH_3$and about 99 percent by weight of hexamethyldisiloxane.

18. A composition according to claim 1 consisting essentially of about 8 percent by weight of 1-methoxy-2-propanol $CH_3OCH_2CH(CH_3)OH$ and about 92 percent by weight of hexamethyldisiloxane.

19. A method of cleaning a surface of an article comprising applying to the surface of an article a cleaning agent which is a composition as defined in accordance with claim 1.

20. The method according to claim 19 in which the article is selected from the group consisting of electronic circuit boards, metal articles, ceramic articles, glass articles, and plastic articles.

21. The method according to claim 20 in which material to be removed from the surface of the article to be cleaned is selected from the group consisting of carbonaceous materials and solder fluxes.

* * * * *